(12) United States Patent
Kumar et al.

(10) Patent No.: US 7,239,570 B2
(45) Date of Patent: Jul. 3, 2007

(54) MAGNETIC MEMORY DEVICE AND METHOD FOR MAGNETIC READING AND WRITING

(75) Inventors: Santosh Kumar, San Jose, CA (US); Subodh Kumar, Glen Allen, VA (US); Divyanshu Verma, Glen Allen, VA (US)

(73) Assignee: MagSil Corporation, Santa Clara, CA (US)

( * ) Notice: Subject to any disclaimer, the term of this patent is extended or adjusted under 35 U.S.C. 154(b) by 414 days.

(21) Appl. No.: 10/725,706

(22) Filed: Dec. 2, 2003

(65) Prior Publication Data

US 2004/0233746 A1 Nov. 25, 2004

Related U.S. Application Data

(60) Provisional application No. 60/471,801, filed on May 20, 2003.

(51) Int. Cl.
*G11C 11/06* (2006.01)

(52) U.S. Cl. .................... 365/225.5; 365/50; 360/313; 360/326

(58) Field of Classification Search ............. 365/225.5, 365/50; 360/313, 326
See application file for complete search history.

(56) References Cited

U.S. PATENT DOCUMENTS

| | | | | |
|---|---|---|---|---|
| 5,751,521 | A  * | 5/1998  | Gill ............................ | 360/314 |
| 6,829,161 | B2 * | 12/2004 | Huai et al. ................... | 365/158 |
| 6,914,746 | B1 * | 7/2005  | Meyer ....................... | 360/78.12 |
| 7,035,062 | B1 * | 4/2006  | Mao et al. ................ | 360/324.2 |

* cited by examiner

*Primary Examiner*—Amir Zarabian
*Assistant Examiner*—Kretelia Graham
(74) *Attorney, Agent, or Firm*—James E. Eakin

(57) ABSTRACT

Disclosed herein are a magnetic memory device and method for storing and retrieving data. The magnetic memory device includes a read disk and a storage disk. The read disk comprises of an array of read heads wherein the individual read head corresponds to a storage element on the storage disk.

18 Claims, 6 Drawing Sheets

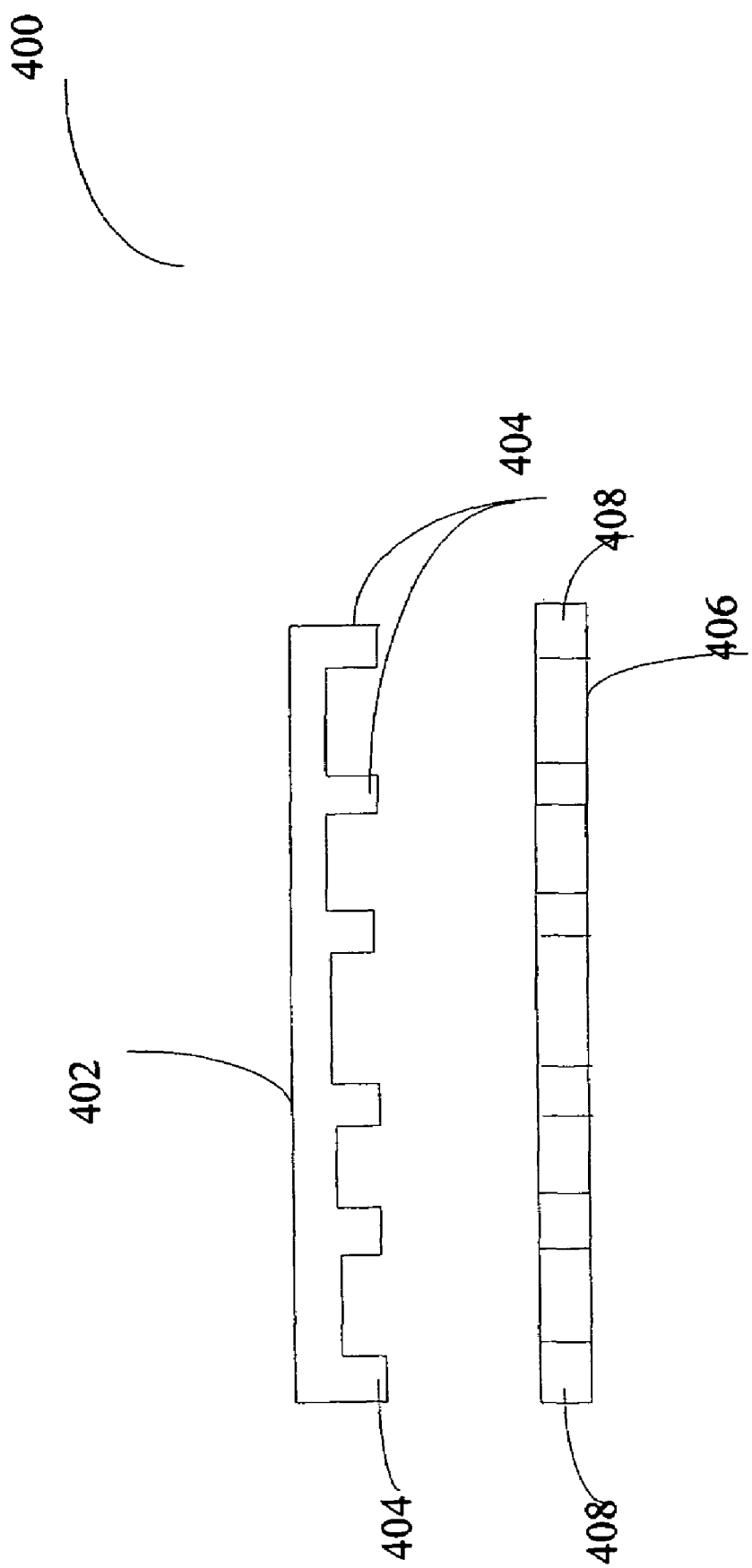

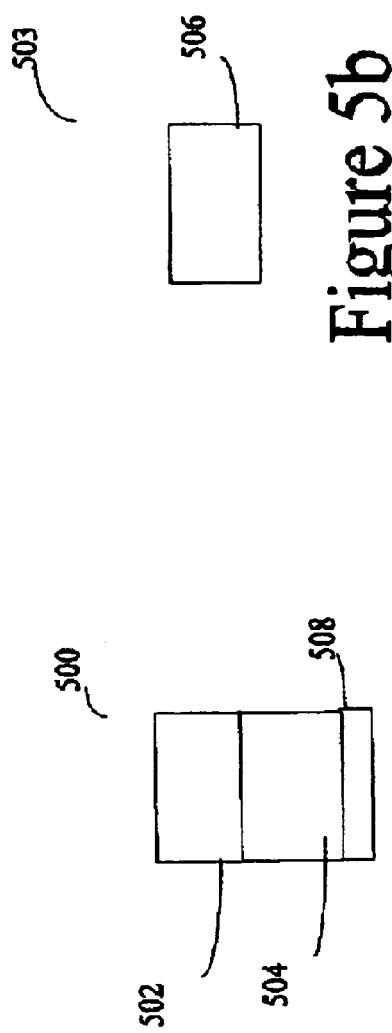
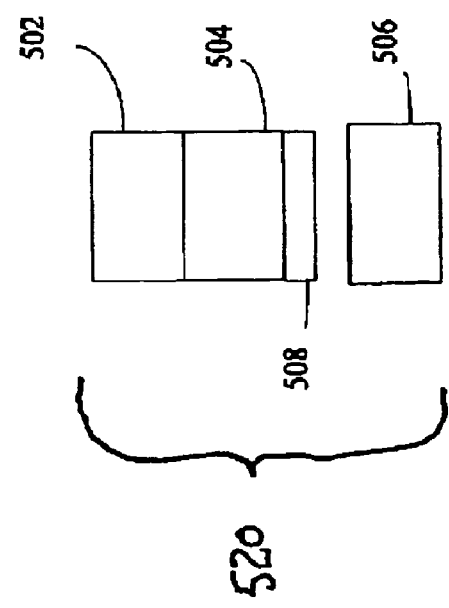
Figure 5a
Figure 5b
Figure 5c

MAGNETIC MEMORY DEVICE AND METHOD FOR MAGNETIC READING AND WRITING

CROSS REFERENCE TO RELATED APPLICATION

This application claims the benefit of U.S. provisional application Ser. No. 60/471,801, filed May 20, 2003 which is fully incorporated by reference.

FIELD OF THE INVENTION

The present invention pertains generally to memory storage devices and particularly to magnetic memory storage devices.

BACKGROUND OF THE INVENTION

Within the field of memories, there is continuing interest in finding ways to increase the storage density and speed. As the personal use of small devices gain popularity, the memory of these equipments has to be modified to match the function and design of these small devices. Particularly, as more and more data needs to be stored in the memory, the memory needs to have the capacity and speed to handle such demand.

The discovery of new phenomena of magnetoresistive (MR) and giantmagnetoresistive (GMR) effect provided a significant advancement in the field of memory technology. This phenomena demonstrated that resistance of multilayer thin film comprised of ferromagnetic layers sandwiching a conducting layer can change significantly depending on the direction of an external magnetic field.

GMR is observed in magnetic metallic layered structures in which it is possible to orient the magnetic moments of the ferromagnetic layers relative to one another. One such type magnetic metallic layered structure consists of a stack of four magnetic thin films: a free magnetic layer, a nonmagnetic conducting layer, a magnetic pinned layer and an exchange layer. Magnetic orientation of the pinned layer is fixed and held in place by the exchange layer. By applying an external magnetic field, the magnetic orientation of the free layer may be changed with respect to the magnetic orientation of the pinned layer. The change in the magnetic orientation generates a significant change in the resistance of the metallic layered structures. The resistance of the structure determines the logical value to be stored therein.

Currently this technology is predominantly used in the disk drives. Disk drives use discs which are coated with a magnetizable medium for storage of digital information in a plurality of concentric data tracks. A track is a concentric set of magnetic bits on the disk. A sector is a part of each track that is defined with a magnetic marking and an ID number. A cylinder is group of tracks with the same radius. In a typical magnetic disk drive, a magnetic disk rotates at high speed and a read-write head uses air pressure to "fly" over the top surface of the disk. The head records information on the surface of the disk by impressing a magnetic field on the disk. Information is read back using the head by detecting magnetization of the disk surface. To access the disk requires a sequence of steps. The total time required to complete such sequence of steps is generally known as the access time. Access time has two major components: seek time and rotational latency. Seek time is the time needed for the read-write head to move radially to the cylinder containing the desired sector. Rotational latency is the additional time waiting for the disk to rotate the desired sector to the disk head. The access time is a sum of the seek time and the rotational latency time. The disk drives available today has an access time of 14 ms and this is too long for the future demand. The speed of the disk drive is negatively impacted by such long access time.

Spindle motors are generally used to rotate the disk at high speeds. A read-write head carried by a head slider is positioned over a track on the surface of the disk to write data to or read data from the track. The head slider is supported by a movable actuator which is controlled to position the read-write head carried by the head slider to a location with respect to the disk while the disk is rotating. However this arrangement using spindle motors are known to have problems. Even minor vibrations or bumps can cause the disk drive to crash. Mechanical constraints are limiting the function of the disk drive. Moreover, as the disk drives are being produced with increasing track densities and decreasing access time, the feedback control systems in modern disc drives must move the sliders to the correct position in a very short period of time. Seek errors may occur if the slider is not moved to the correct position.

As can be seen there is a clear need in the industry to have disk drives with shorter access time and without the mechanical constraints.

Meanwhile, a magnetic memory device known as Magnetoresistive Random Access Memory (MRAM) has been developed on an Integrated Circuit (IC) chip. This type of memory device generally includes conductive lines positioned perpendicular to one another. Each conductive lines act as either write or a bit line. A magnetic stack is placed where the two conductive lines cross. An electrical current flowing through one of the conductive line induces a magnetic field around that conductive line. A different current flowing through the other conductive line induces another magnetic field around the second conductive line. The induced magnetic fields align or realign the magnetic dipoles in the magnetic stack. The resistance of the magnetic stack determines the logical value to be stored therein.

For the MRAM the transistor logic circuits are embedded in the IC chip itself. As a a result of having transistor logic circuit in close proximity with the magnetic stack, the magnetic field interferes with the functions of the logic circuit. The magnetic field interference with the control circuits also makes it difficult to integrate MRAM various devices. Moreover, the amount of memory available through the use of an MRAM is only in the range of 1 Mbit. This amount of memory is not suitable for most applications. Also, since the MRAM is basically an IC chip it is not adaptable to other types of fabrications especially into memory devices like a disk drive.

While MRAMs provide a non-volatile memory it is not suitable for most of the present day applications due to its small amount of memory and inability to integrate, small amount of memory.

As can be seen there is clear need in the industry to have a memory device that is fast with a large memory and is durable.

SUMMARY OF THE INVENTION

It is accordingly an object of the invention to provide a memory storage device that overcomes the above mentioned disadvantages of the prior art devices of this general type.

One aspect of the invention includes a magnetic memory storage device having a read disk and a storage disk. The read disk includes of an array of read heads. The storage disk comprises of an array of magnetic storage elements. The magnetic storage elements are disposed between a plurality of conducting lines. The individual read head on the disk has a corresponding storage element on the storage disk.

The individual read head includes two layers. The first layer includes a pinned layer and a first free layer. The magnetic field of the pinned layer fixed. The magnetic field orientation of the free layer may vary depending on other variables.

The writing operation involves passing current through the conducting lines on the storage disk. The current through conducting lines will induce a magnetic field around the storage element. The storage element includes a second free layer. The direction of magnetization of second free layer may vary. Accordingly, the induced magnetic field fixes the direction of the magnetization of the second free layer. The direction of magnetization of the second free layer determines the value to be stored.

The reading and writing operation in the memory storage device is performed and controlled by different circuits. For reading, a control circuit selects a read head from the array of read heads on the read disk to perform the reading. The second free layer of the corresponding storage element in the storage disk controls the direction of the magnetization of the first free layer. The resistance value of the read head depends on the magnetic direction of the pinned layer and the free layer. As the direction of the first free layer is controlled by the second free layer of the storage element, the direction of the first free layer depends on the stored value of the storage element. By measuring the resistance of the read head the stored value may be determined.

These and other objects, features, and advantages of the present invention will become more apparent upon reading the following detailed description in conjunction with the accompanying drawings.

BRIEF DESCRIPTION OF THE DRAWINGS

FIG. 3b is a schematic cross sectional view of a storage cell 300 shown in FIG. 3a.
FIG. 4 shows a cross sectional view of structure 400 having read head 402 and storage disk 406.
FIG. 5a shows a cross sectional view of a read head 500.
FIG. 5b shows a cross sectional view of a storage element 403.
FIG. 5c shows a cross sectional view of a storage cell unit 520 having a read disk and a storage element.

DETAILED DESCRIPTION OF THE DRAWINGS

Figure 1:
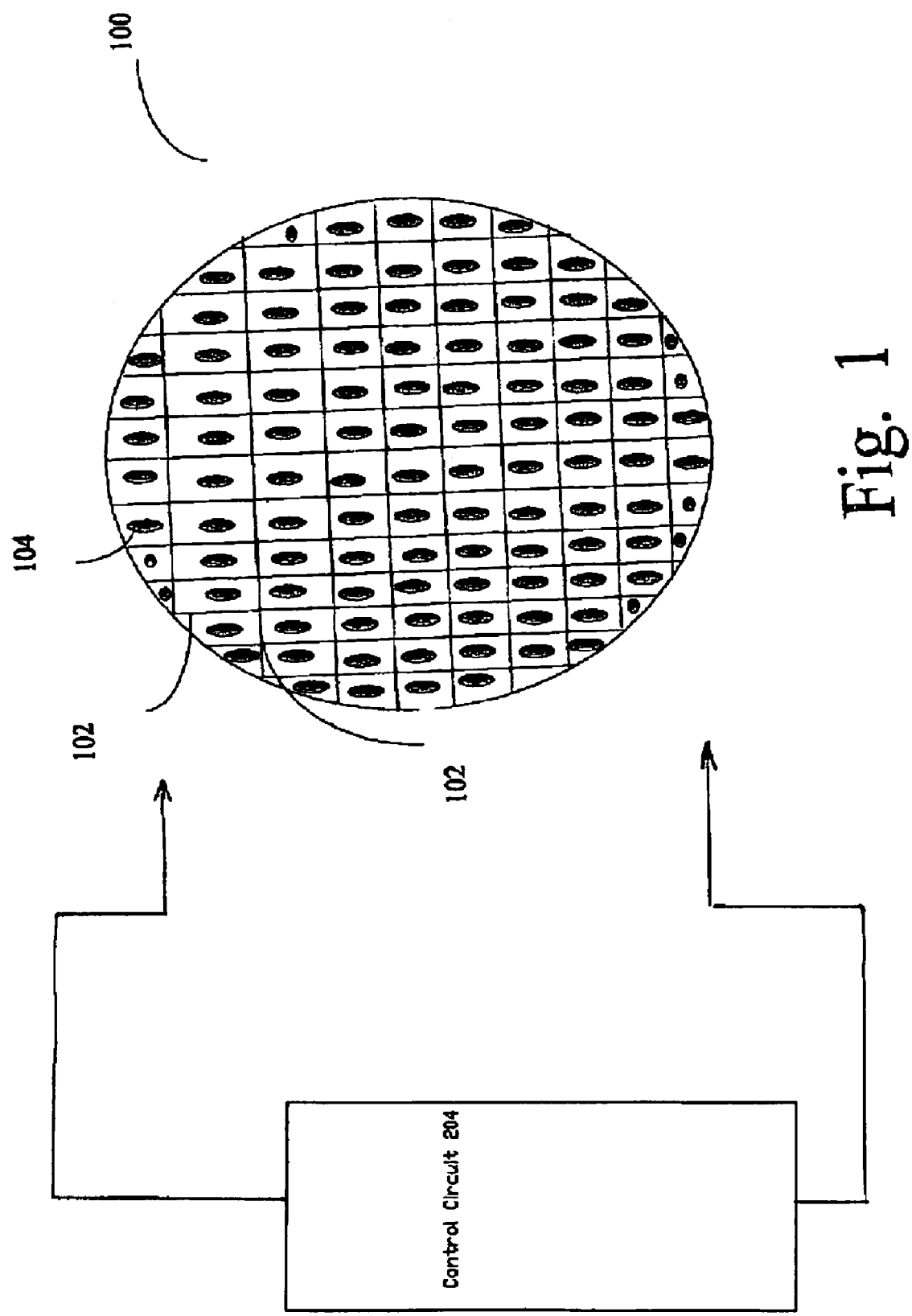
FIG. 1 is a schematic top view of a storage disk 100.

FIG. 1 shows a schematic top views of a storage disk 100. The storage disk 100 comprises of a plurality of conducting lines 102. Disposed between the conducting lines are an array magnetic storage elements 104. A control circuit (not shown) will select a particular storage element from the array of magnetic storage elements. A current through the conducting lines will induce a magnetic filed and it magnetizes the selected storage element. The magnetic storage elements have a single axis of magnetization. The direction of the magnetization is fixed by the induced magnetic field and the direction of magnetization is interpreted as a binary 1 or 0.

Each of the magnetic storage element is capable of storing at least one bit of data. Each magnetic storage element 104 is exchangely isolated from other storage elements in the array. However the storage elements 104 are strongly exchange coupled within the array of storage elements that enable them to function as a large single magnetic unit. It is understood that the magnetic storage elements shown in FIG. 1 are not drawn to scale. Each magnetic storage element are essentially the same size and has a single magnetic domain.

Figure 2:
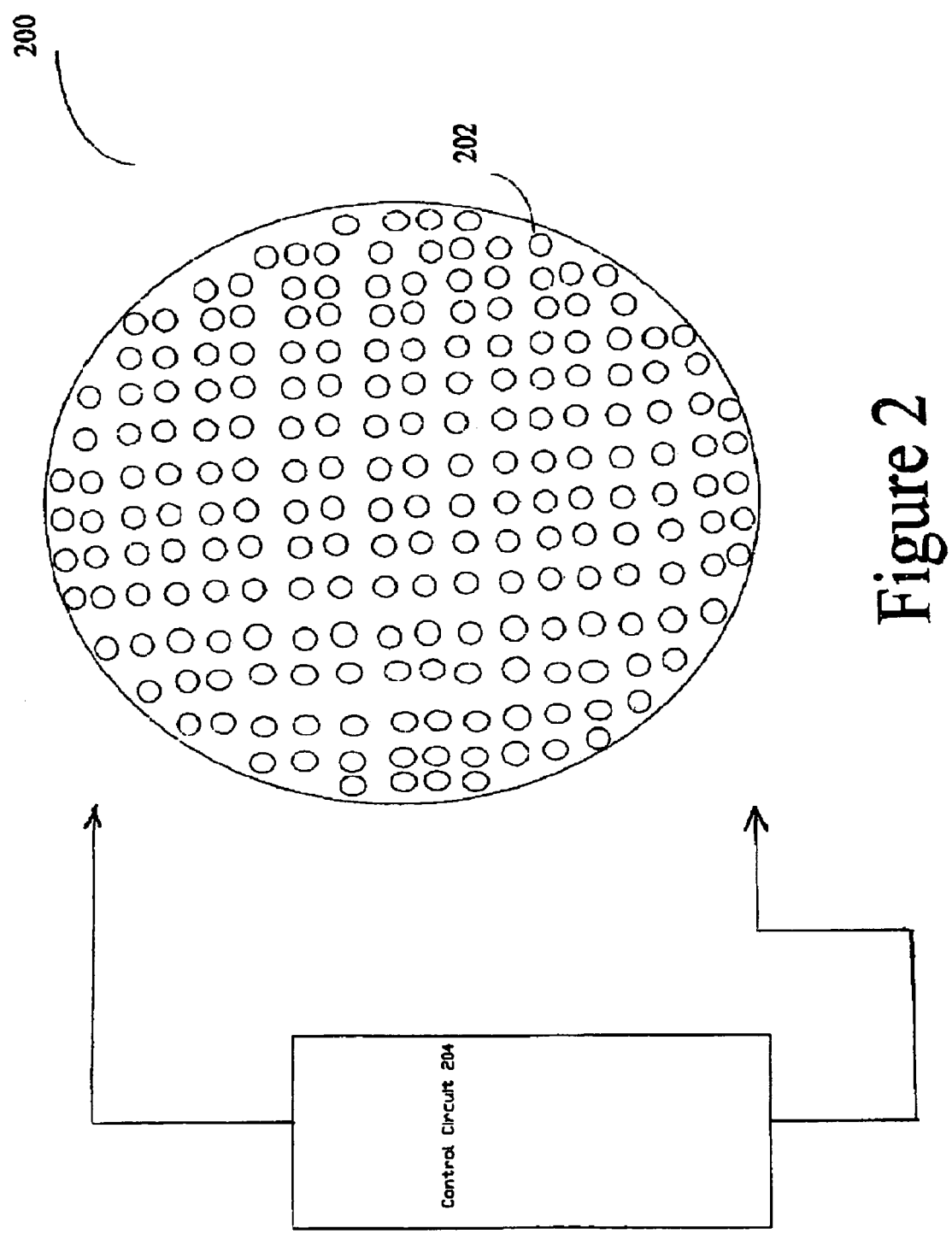
FIG. 2 is schematic bottom view of a read disk 200.

FIG. 2 is a schematic bottom view of a read disk 200. The read disk 200 comprises of an array of read heads 202. Even this figure is not drawn to scale. Each one of the read heads on the read disk correspond to a storage element on the storage disk. The resistance of the read head depends on the direction of the magnetization of the corresponding storage element on the storage disk in FIG. 1. The resistance of the read head 200 determines the logical value to be stored therein.

The reading and writing process in this embodiment of the invention is accomplished by two different circuits. Writing is done by the storage disk and its controlling circuits and reading is done by the read head and its controlling circuits. The read heads may be an MR, GMR, or CMR. Separating the circuits to accomplish reading and writing provides a lot more control over the circuit. Also, by having corresponding heads for each storage element the seek and latency time associated with the disk drives are virtually eliminated. It is understood that even though here we are showing a one to one mapping between the storage elements and the read heads that is not a necessity. Several storage elements may be mapped to a single read head.

It should be appreciated that the current design avoids the need for mechanical components like spindle motor and servo. As a result, this memory storage device is not limited by the mechanical capabilities. Another unique feature of the invention is that the disks are not required to spin at high speeds thus providing reliability and making it immune from crashes. Also, this design is more durable as the present embodiment virtually eliminates the dependence on mechanical components in turn it is less susceptible to damage from shock or vibration.

The present invention keeps the control circuits to select the desired storage element during write operation and the read head during read operation are external to the read disk and the storage disk. This allows the active circuit elements to be kept away from the magnetic material and this will prevent leakage and bit to bit interference.

Figure 3A:
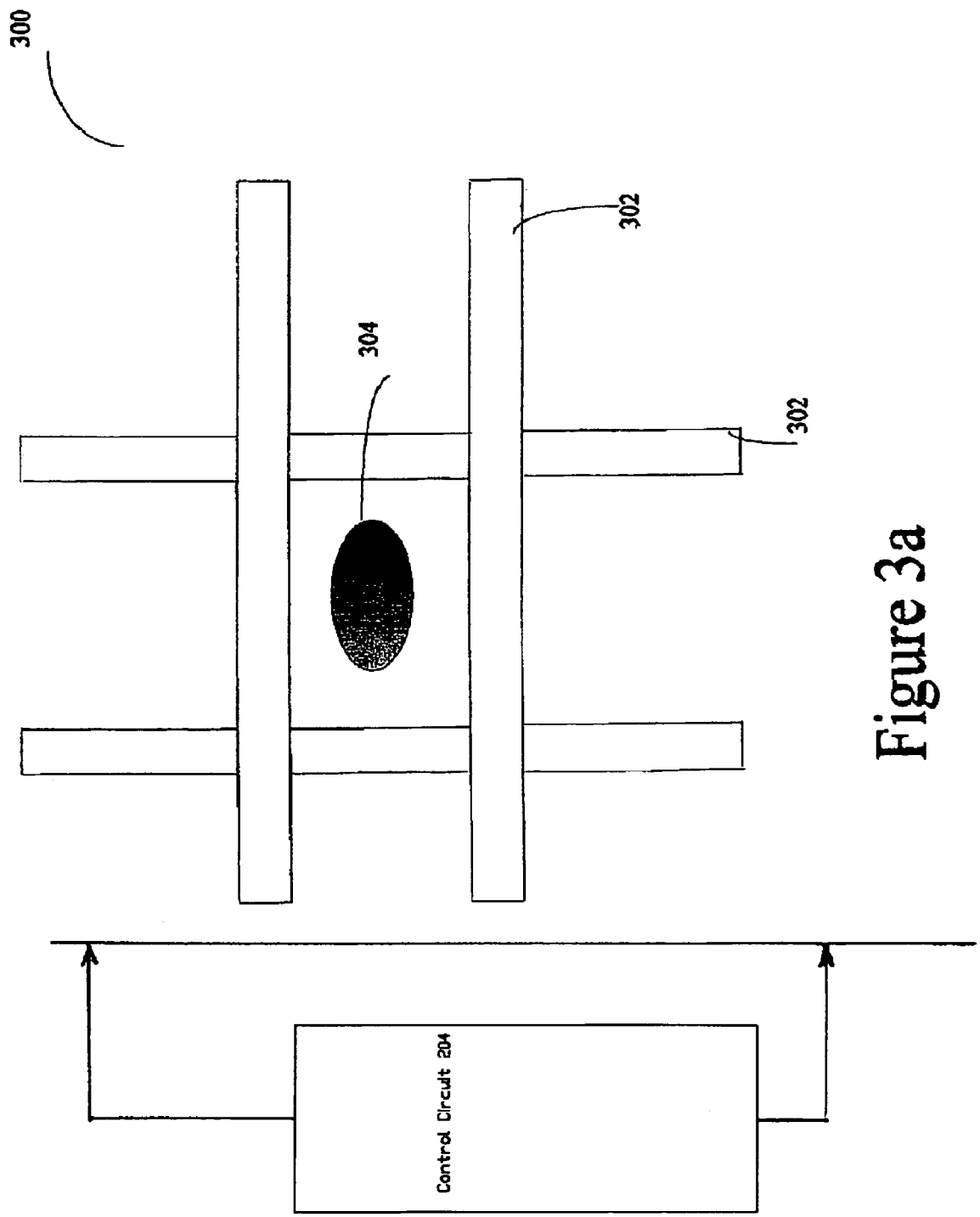
FIG. 3a is a schematic top view of storage cell 300.
Figure 3B:
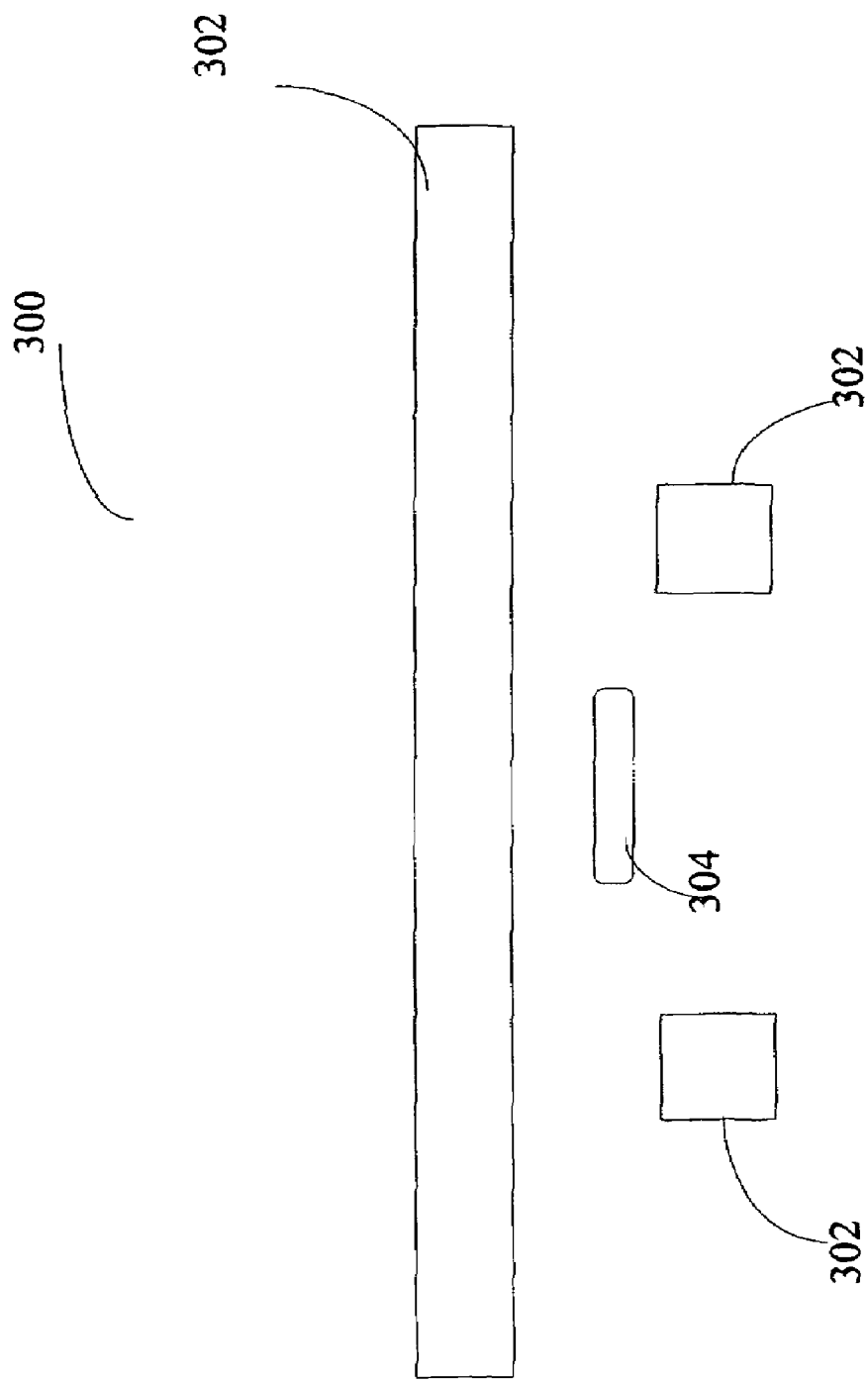

FIG. 3a is top view of an individual storage cell 300 on a storage disk (not shown) similar to the one shown in FIG. 1. The cell 300 includes conductive lines 302. A magnetic storage element 304 disposed between the conductive lines. A current through the conductive lines will induce a magnetic field around the storage element. This in turn will magnetize the storage element. The magnetic storage element has a single axis of magnetization. The direction of the magnetization is interpreted as a binary 1 or 0. FIG. 3b is the cross sectional view of the storage cell 300 shown in FIG. 3a. FIG. 3b shows the conductive lines 302 and magnetic storage element 304 disposed between the conductive lines.

FIG. 4 shows a cross sectional view of a magnetic storage device 400. The device include a read disk 402 and a storage disk 406. The read disk has read heads 404. The storage disk 406 has magnetic storage elements 408 disposed between conductive lines (not shown). A current through the conductive lines (not shown) will induce a magnetic field. This in turn will magnetize the storage element. The magnetic storage element 408 has a single axis of magnetization. The direction of the magnetization is interpreted as a binary 1 or 0. Depending on the value stored in the storage element i.e. 1 or 0 the resistance of the read head 404 is changed. Reading is done by measuring the resistance of the read head.

FIG. 5*a* shows a cross sectional view of a read head 500. The read head includes a pinned layer 502 and a first free layer 504. The direction of the magnetization in the pinned layer 502 is fixed. The direction of the magnetization of the first free layer 504 may vary. FIG. 5*b* shows a cross sectional view of a storage element 503. The storage element has a second free layer 506. The direction of the magnetization of the second free layer controls the direction of magnetization of the first free layer 504 in the read head 500. FIG. 5*c* shows a magnetic unit cell 520 in the magnetic storage device (not shown). The magnetic unit cell 520 includes read head 500 of FIG. 5*a* and a storage element 503 of FIG. 5*b*. The read head 500 and the storage element 503 are separated by an optional conductive layer 508 on the read head. The conductive layer 508 acts as a router to make connection with the control circuit. It is fabricated from paramagnetic material such as tantalum. The pinned layer 502 and the first free layer 504 of the read head 500 makes up the MR, GMR of the CMR.

The method of writing is done by passing current through conductive lines (not shown) surrounding the storage element 503 which induces a magnetic field. The induced magnetic field magnetizes the second free layer 506 of the storage element 503. The direction of the magnetization of the second free layer depends on the logical value to be written. The second free layer 506 and the first free layer 504 are magnetically coupled thus the direction of the magnetization of the second free layer 506 determines the direction of magnetization in the first free layer 504. If the direction of the magnetization of the first free layer 504 and the pinned layer 502 are in the same direction the resistance will be low. If the direction of the magnetization of the magnetization of the first free layer 504 and the pinned layer 502 are in the opposite direction the resistance would be high. Accordingly if the resistance is low the value read will be 1 and if the resistance is high the value read will be a logical zero. The method of reading is done by measuring the resistance of the first free layer 504 and the pinned layer 502.

Even though the description shows a read disk and a storage disk, it is understood that the devices need not circular like a disk. It can take any shape as it is not an integrated circuit (IC) chip. This can be adapted into other types of devices such as a cell phone, personal digital assistant (PDA), video games, MP3s etc. It can be used for mass storage of digital data. The memory of the storage device described herein varies from mega bit to the giga bit range depending on application. The memory storage device can be integrated virtually into any device because the active circuit elements are separated from the magnetic elements. Since the memory storage device is not an IC chip it can be made to the fit the shape of the device into which it would be incorporated into.

Additional advantages include higher amount of current through the conducting lines as the area used for storage may range from 1 square centimeter to several hundred square centimeter. Also the number of conducting lines, around the storage element, through which the desired current would pass, to magnetize the free layer, in the storage element, may be adjusted according to the amount of current needed for magnetization.

While embodiments of the invention have been illustrated and described, it is not intended that these embodiments illustrate and describe all possible forms of the invention. Rather, the words used in the specification rather than limitation, and it is understood that various changes may be made without departing from the spirit and scope of the invention.

What is claimed is:

1. A magnetic mass storage memory device comprising: a) a read layer having an array of read heads; b) a storage layer having an array of magnetic storage elements wherein the read heads are associated with at least one storage element on the storage layer; c) a control circuit to select the desired storage element that controls an orientation of a magnetic field of an associated read head, and d) at least one pair of write lines disposed one on either side of the magnetic storage elements and controlled by the control circuit for effecting a change in the orientation of a selected storage element.

2. The memory device according to claim 1, wherein the read head comprises: a) a pinned layer; and b) a first free layer.

3. The memory device according to claim 2, wherein the pinned layer has a fixed magnetic orientation.

4. The memory device according to claim 3, wherein the first free layer has a variable magnetic orientation.

5. The memory device according to claim 4, wherein the storage element comprising a second free layer.

6. The memory device according to claim 5, wherein the second free layer has a variable magnetic orientation.

7. The memory device according to claim 6, wherein the magnetic orientation of the first free layer is regulated by the magnetic orientation of the second free layer.

8. The memory device according to claim 7, wherein a resistance of the associated read head is indicative of a value stored therein.

9. The memory device according to claim 8, wherein the associated read head is an MR.

10. The memory device according to claim 8, wherein the associated read head is a GMR.

11. The memory device according to claim 8, wherein the associated read is a CMR.

12. A magnetic mass storage memory device comprising:
a) a read layer having an array of read heads, each read head comprising a plurality of magnetic layers; b) a storage layer having a plurality of conductive lines arranged in at least one pair with an array of magnetic storage elements disposed between the conductive lines in locations corresponding to the read heads; and c) a control circuit to select a desired storage element from the array of magnetic storage elements such that a current through the conductive lines will induce a magnetic field in the selected storage element wherein the induced magnetic field controls a direction of a magnetic field of at least one layer in the plurality of magnetic layers in the corresponding read head.

13. The memory device according to claim 12, wherein the plurality of magnetic layers comprises: a) a pinned layer; and b) a first free layer.

14. The memory device according to claim 13, wherein a direction of the magnetic field of the pinned layer is fixed.

15. The memory device according to claim 14, wherein the direction of the magnetic field of the first free layer is variable.

16. The memory device according to claim 15, wherein the magnetic storage element comprises a second free layer.

17. The memory device according the claim 16, wherein a direction of a magnetic field of the second free layer is regulated by a current through the plurality of conducting lines.

18. A method of magnetic reading on a storage device comprising the steps of: a) selecting a magnetic storage element, from an array of magnetic storage elements on a storage layer; b) passing current through conducting lines surrounding the magnetic storage element, the conductive lines arranged in at least one pair; c) inducing a magnetic field around the magnetic storage element by the current through the conducting lines; d) setting the direction of magnetization of a second free layer in the storage element and controlling a direction on the magnetization of a free layer in a read head associated with the storage element from an array of read heads on a read layer by the induced magnetic field; and (e) measuring a resistance of the associated read head.

* * * * *